United States Patent [19]

Bockelman

[11] Patent Number: 5,748,506
[45] Date of Patent: May 5, 1998

[54] CALIBRATION TECHNIQUE FOR A NETWORK ANALYZER

[75] Inventor: David E. Bockelman, Plantation, Fla.

[73] Assignee: Motorola, Inc., Schaumburg, Ill.

[21] Appl. No.: 653,861

[22] Filed: May 28, 1996

[51] Int. Cl.$^6$ .................................................. G01R 35/00
[52] U.S. Cl. ...................... 364/571.02; 324/601; 324/638
[58] Field of Search ........................... 364/514 R, 514 B, 364/571.01, 571.02, 571.04, 571.08; 324/601, 638; 395/182.02, 182.04, 200.54; 333/17.1; 371/20.1; 370/245

[56] References Cited

U.S. PATENT DOCUMENTS

| | | | |
|---|---|---|---|
| 5,117,377 | 5/1992 | Finman | 364/578 |
| 5,442,296 | 8/1995 | Schiek et al. | 324/601 |
| 5,548,538 | 8/1996 | Grace et al. | 364/571.04 |
| 5,608,330 | 3/1997 | Heuermann et al. | 324/601 |

OTHER PUBLICATIONS

Barr, J.T., Jr. and Pervere, M.J., *A Generalized Vector Network Analyzer Calibration Technique*, pp. 51–60, Hewlett Packard Network Measurements Division, Santa Rosa, California (no date).

Eul, H.J. and Schiek, B., *Thru–Match–Reflect: One Result of a Rigorous Theory for De-Embedding and Network Analyzer Calibration*, pp. 908–914, Proc. 18th European Microwave Conference, 1988.

Primary Examiner—Michael Zanelli
Assistant Examiner—Edward Pipala
Attorney, Agent, or Firm—Barbara R. Doutre

[57] ABSTRACT

A calibration technique (200) uses a set of calibration standards to solve for unknown network parameters of calibration standards as well as error correction terms. A set of standards provides an over-determined system of calibration equations having more calibration equations than unknown error terms (202). The additional calibration equations are used to solve for the unknown network parameters of the calibration standards (210). Once solved, the network parameters of the calibration standards provide a more accurate determination of error terms for a network analyzer (214).

20 Claims, 4 Drawing Sheets

CALIBRATION TECHNIQUE FOR A NETWORK ANALYZER

TECHNICAL FIELD

This invention relates in general to network analyzers and more particularly to the calibration methods of network analyzers.

BACKGROUND

Network analyzers are widely used in radio frequency (RF) and microwave applications for the measurement of a circuit's unknown scattering parameters (s-parameters). Since network analyzers are non-ideal, the measurements made with network analyzers have errors. These errors can be grouped into two major categories: systematic and non-systematic. Systematic errors include all static (repeatable) errors, and non-systematic errors include noise, drift, and other time variant errors.

Theoretically, any systematic error can be characterized. This process, called calibration, involves measuring certain well known devices, called standards, with the non-ideal network analyzer. With proper application, these raw measurements can be used to solve for all systematic errors. After calibration, the systematic network analyzer errors can be removed from the measurements of any unknown device; this is called error correction.

Provided the network analyzer system is static (and/or time variant errors are negligible) and that there is sufficient dynamic range, the accuracy of calibration is limited by the accuracy to which the standards are known. Hence, it is highly desirable for a calibration method to reduce the required number of known parameters of the standards. Such calibrations have been successful at increasing calibration accuracy. One example of this approach is the Line-Reflect-Match (LRM) calibration, where one standard is an unknown reflection. This LRM technique however, is limited by its simplified error model and can not accommodate standards having more than one unknown parameter thereby restricting it to two-port network analyzer applications.

As the complexity of error models increases, the minimum number of required standards increases. As a result, the desire to reduce the number of unknown network parameters of calibration standards is even greater. Accordingly, there is a need for a calibration technique which provides improved accuracy for more complex error models.

DETAILED DESCRIPTION OF THE PREFERRED EMBODIMENT

In accordance with the present invention, a network analyzer calibration technique to be described herein, exploits the properties of the general multi-port calibration problem. Broadly stated, the multi-port calibration problem requires more standard measurements than the number of unknown errors (t-terms). The calibration technique of the present invention uses these extra measurements to solve for some of the standards' network parameters. Thus, the number of known standards can be reduced. To appreciate the scope of the calibration technique of the present invention, a full description of a prior art network analyzer error model is useful.

Figure 1:
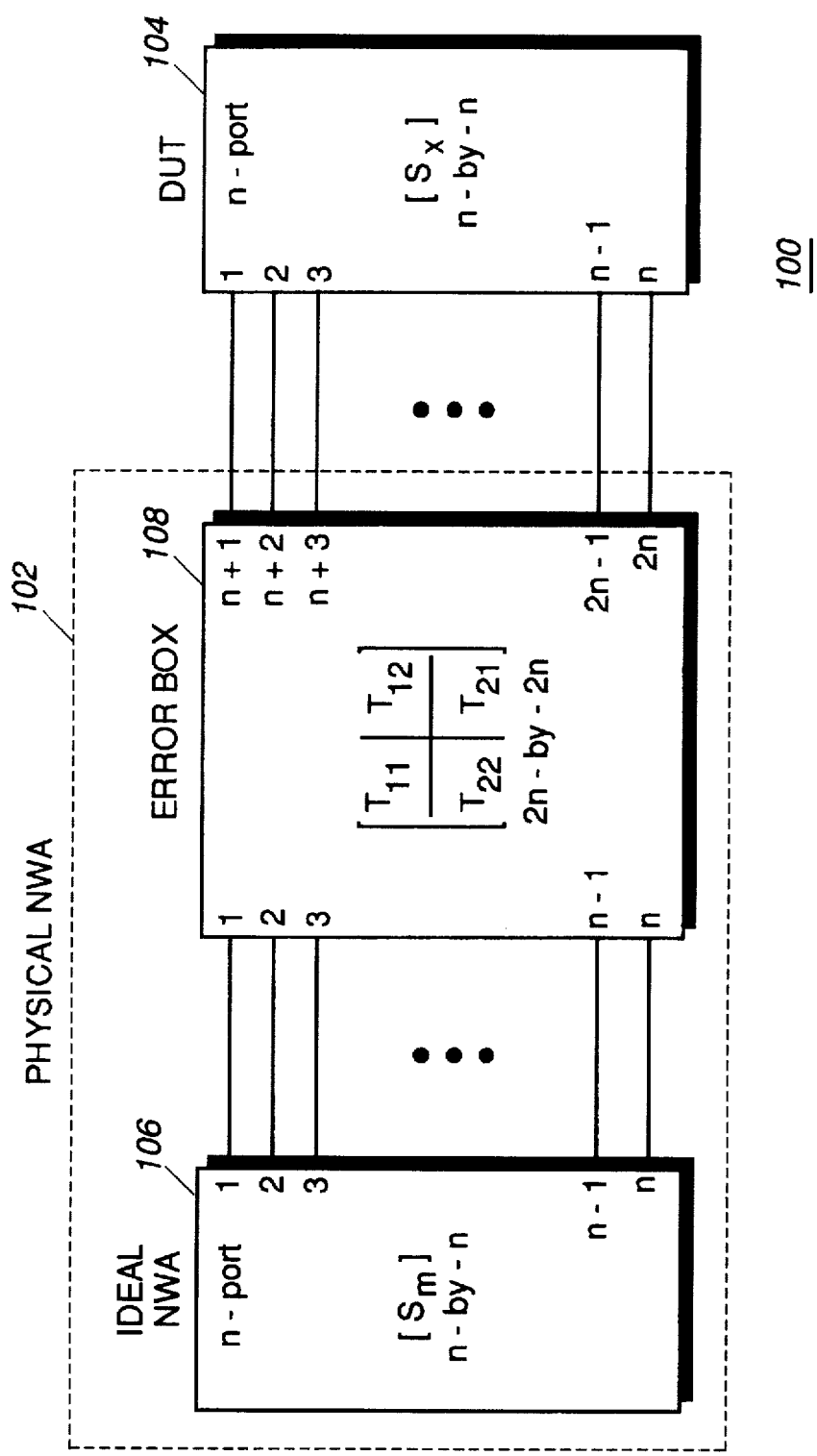
FIG. 1 is a prior art block diagram of a full isolation network analyzer error model.

Referring now to FIG. 1, there is shown a prior art error model 100 for a general n-port network analyzer (NWA) 102 measuring a device under test (DUT) 104. Network analyzer 102 is represented by an ideal network analyzer 106 and an error box 108. In error model 100, variable n represents the number of ports of the analyzer for the DUT 104 having n ports. Error model 100 includes all possible systematic sources of error in a linear time invariant network analyzer. Error box 108 represents all unknown error (signal) paths including undesired crosstalk between the ports. For the purposes of this application, complete port-to-port isolation of a network analyzer, including all crosstalk paths, will be referred to as full isolation. In general, there are $4n^2$ unknowns, and calibration is the process, technique, or method of determining these unknowns.

When the error box 108 is expressed in chaining scattering parameters (called t-parameters), the relationship between measured and actual DUT scattering parameters (s-parameters) can be represented by a linear function of the unknown errors. The defining equation is:

$$i\, T_{11}S_{xi} + T_{12} - S_{mi}T_{21}S_{xi} - S_{mi}T_{2} = \bar{0} \quad (1)$$

where $T_{11}$, $T_{12}$, $T_{21}$, and $T_{22}$ represent the matrix partitions of the error box matrix, and $S_{xi}$ and $S_{mi}$ represent the actual and measured s-parameters of the i-th standard, respectively. Upon expansion, equation (1) gives $n^2$ equations which are linear in elements T. This set of expanded equations can be written in a compact form as:

$$A \cdot \bar{t} = \bar{0} \quad (2)$$

where A represents a matrix of coefficients and t represents a vector of unknowns constructed from the elements of T. Equation (1) or its compact form (2) represent a system of calibration equations.

Several possible conditions influence the existence of solutions to the set of equations. The matrix of coefficients, A, is characterized by a dimension and a rank, and if A has at least as many rows as columns, then a solution can exist. With this condition, if the rank of the matrix of coefficients, A, is equal to the number of columns minus one, then a non-trivial solution exists. This solution has one degree of arbitrariness since a solution multiplied by any complex number is also a solution. In other words, in this case, the solution space of equation (2) is spanned by a single vector. The arbitrary scale factor is unimportant as it is factored out during DUT data correction subsequent to the calibration process. This solution will be referred to as an ordinary solution. For the purposes of this application, an ordinary solution will be defined as being unique within a complex scalar.

If A is rectangular with more rows than columns (e.g. with dimension M-by-$4n^2$, where M>$4n^2$ and n is the number of ports of the DUT) and its rank is at least to $4n^2-1$, then the system is over-determined. When a system is over-determined, there are various ways to select and combine solutions. Singular value decomposition (SVD) is a method widely used to give a single solution to over-determined systems. The SVD method minimizes the root-mean-square (RMS) error between data and the solution to equation (2).

Another method of solving for equation (2) is to build a system of equations such that the matrix of coefficients, A, is a square ($4n^2$-by-$4n^2$) matrix and its rank is exactly $4n^2-1$. In this case, the solution of (2) is the nullspace of A. The nullspace can be calculated using any well-known method. Since each standard results in $n^2$ equations, the simplest way to create a square matrix is to use four standards. However, the nature of embedding equation (1) is such that four standards will always result in a coefficient matrix A of rank no more than $4n^2 - n$. Hence, no ordinary solution exists to the system of calibration equations (2) with only four standards.

The problem of reduced rank can be solved with the addition of another standard. The full coefficient matrix is then of dimensions $5n^2$-by-$4n^2$, with rank $4n^2-1$. As a result, the system is over-determined and can not be solved directly with the nullspace of A. Instead SVD can be used to approximate a solution to the system of calibration equations. The SVD approach to calibration has been used in network analyzers in the past with marginal success. The approximate nature of the SVD solution limits the ultimate measurement accuracy that is practically achievable.

Figure 2:
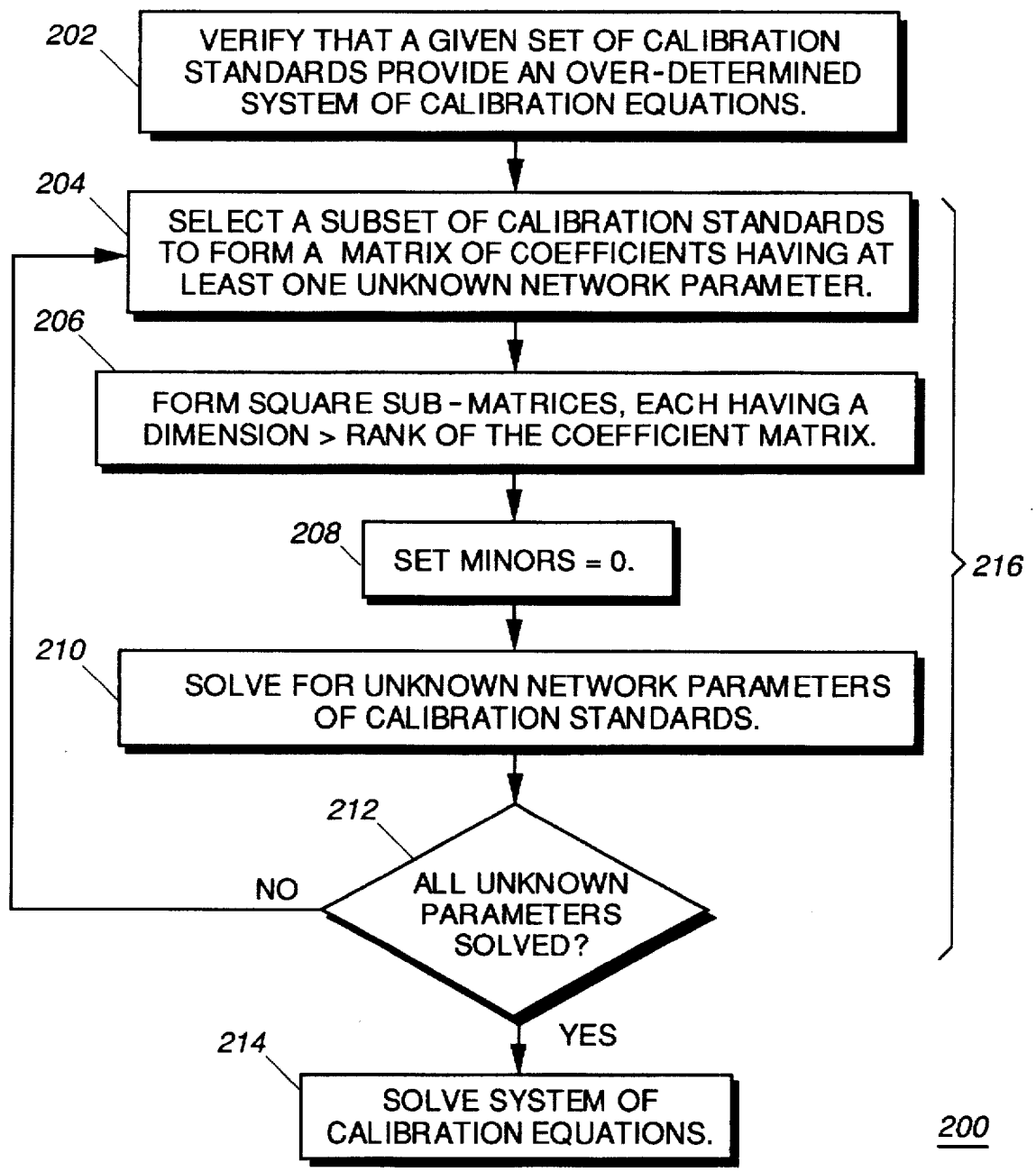
FIG. 2 is a flowchart of a calibration technique in accordance with the present invention.

The calibration technique of the present invention, to be described in FIG. 2, eliminates the necessity of the SVD solution. The calibration technique of the present invention utilizes the extra equations of the over-determined system of equations to solve for unknown network parameters of the calibration standards. The calibration technique of the present invention then uses these solved network parameters of calibration standards to solve for the error terms (with the use of the nullspace) of equation (2) in the over-determined system. By solving for the standards' network parameters during the calibration process, a more accurate calibration can take place without approximation. The calibration technique of the present invention provides the advantage of being able to solve for multiple unknown network parameters of multiple calibration standards.

Referring now to FIG. 2, there is shown the calibration technique 200 in accordance with the present invention. Step 202 starts the technique by verifying that, given a set of calibration standards, the system of calibration equations (2) is over-determined. An over-determined system is preferably created by adding at least one calibration standard to the calibration process having no ordinary solution. Thus, more calibration equations than unknown error correction terms (t-terms) are generated, and the over-determined system is provided.

Next, a subset of the calibration standards is selected to create a matrix of coefficients having at least one of the unknown network parameters of the calibration standards at step 204. The matrix of coefficients is characterized by a dimension and a rank, and in accordance with the preferred embodiment of the invention, the matrix of coefficients is selected such that its rank is less than its dimension. Minors are then formed at step 206, each minor having a dimension greater than the rank of the matrix of coefficients created in the subset of step 204. A minor is the determinant of a square sub-matrix, the square sub-matrix being formed from the matrix of coefficients. The number of minors is equivalent to the number of unknown network parameters of the calibration standards in the subset of step 204. The minors are set equal to zero in step 208, and the unknown network parameters of the calibration standards are solved from the set of minor equations in step 210.

The step of selecting 204 is repeated with a new subset of calibration standards, and steps 206, 208, and 210 are also repeated until all the unknown network parameters of the calibration standards have been solved as checked at step 212. Once all the unknown network parameters of the calibration standards have been solved the coefficient matrix is completely known and the system of calibration equations can be solved for the error correction terms (t-terms) at step 214. Once the t-terms are solved, all the errors described in the error model of FIG. 1 can be corrected.

Figure 3:
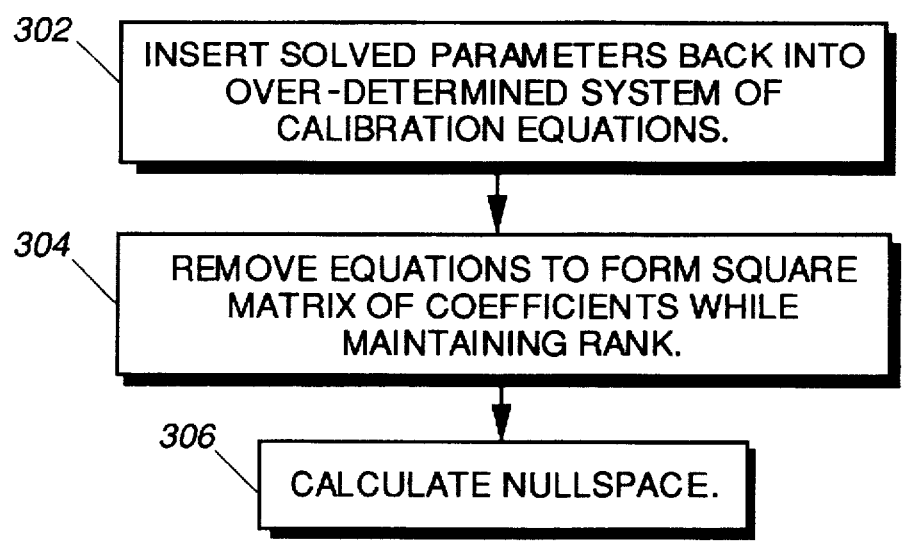
FIG. 3 is a flowchart of the preferred embodiment of the final step of the calibration technique shown in FIG. 2.

The preferred method of solving for the error terms at step 214 is described in the flowchart of FIG. 3. The solved network parameters of the calibration standards are re-inserted into the over-determined system of calibration equations at step 302. Next at step 304, calibration equations are selected such that the resulting coefficient matrix is square and has a rank equal to its dimension minus one. The nullspace of the coefficient matrix is the solution to the error terms. While other techniques, such as SVD, can be used to solve for the error terms of step 214, the preferred method described by the invention provides for improved accuracy since all network parameters of the standards are solved and no approximation is required.

To summarize the steps of the calibration technique 200 in accordance with the present invention, step 202 verifies the system of calibration equations is over-determined; steps 204, 206, 208, 210, and 212 (grouped by designator 216) solve for unknown network parameters of the calibration standards using the additional system of calibration equations. Step 214 then solves for the error terms of the system of calibration equations, preferably using the preferred technique described in FIG. 3.

Consider a calibration process in which all error terms in FIG. 1 are to be found. In accordance with the present invention, at least five standards must be measured. The coefficient matrix of equation (2) has dimensions $5n^2$-by-$4n^2$ and has a rank of $4n^2-1$, indicating an over-determined system of equations. The system of equations has $n^2$ extra equations that can be used to reduce the amount of known network parameters, such as s-parameters, in the standards. When any subset of four standards is selected the rank of the resulting square coefficient matrix is $4n^2 - n$. Any minor having a dimension greater than the rank of the square coefficient matrix will have a zero determinant by definition. So, a minor having dimensions of say $(4n^2-n+1)$-by-$(4n^2-n+1)$ can be formed, and if one of the standard's s-parameter is unknown, then it can be solved by forcing the minors to be equal to zero. The total number of minors created should be equivalent to the number of unknown parameters in the square coefficient matrix. Different combinations of four standards can be selected to create other subsets to solve for additional unknowns in other standards.

There are many possible implementations for the calibration technique 200 described by the invention. Another example illustrates the value of this approach. For a two-port network analyzer (n=2), with a full isolation model, such as that shown in FIG. 1, five standards can be utilized to derive a solution. One appropriate set of standards is: transmission line, reciprocal device (such as an attenuator), matched load, short, and open. With the two-port problem, the number of unknown errors is 16. With any four standards, the rank of the coefficient matrix, A, is 14, and all 15-by-15 minors will be set to zero. By replacing some of the s-parameters of the standards with variables, these variables can be solved by setting the minors equal to zero. For example, three s-parameters of the reciprocal device and the s-parameter of the short and open can be replaced with unknowns (for a total of five unknown parameters). These unknowns can then all be determined by simultaneously solving for five minor equations. After the solution to the standards has been determined, the error terms (the t terms) can be determined to complete the calibration process.

Figure 4:
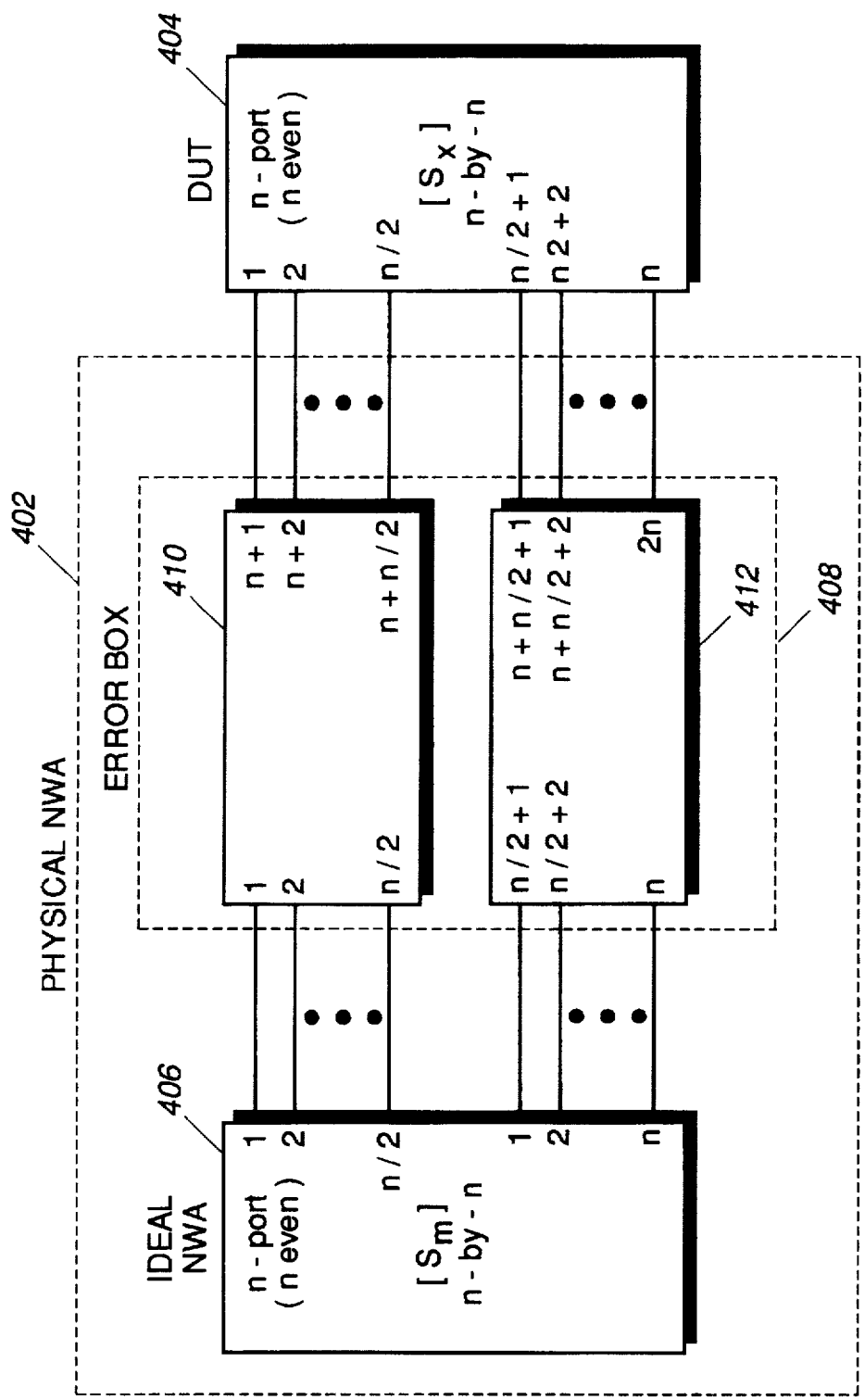
FIG. 4 is a prior art block diagram of a half isolation network analyzer error model.

While the calibration technique 200 of the present invention has been discussed in terms of correction for all error paths, or full isolation, it also extends itself to other systems where isolation between some paths is desired while other paths are neglected. Referring now to FIG. 4, there is shown a prior art error model 400 for a network analyzer where the cross talk paths have been split into two groups. Error model 400 includes a block diagram representation of a network analyzer 402 measuring a device under test (DUT) 404. Network analyzer (NWA) 402 is represented by an ideal network analyzer 406 and an error box 408. When the number of the DUT ports is even, the ports can be grouped into two sets of ports (410, 412) which are ideally isolated from each other.

The error model 400, which will be referred to as a half-isolation error model, can be encountered in some practical measurement situations such as wafer probe measurement with differential network analyzers. In the wafer probe case, two dual RF probes are typically used. Within each dual probe there is undesired coupling that must be corrected, while crosstalk between the two dual probes is neglected.

In general, the number of unknowns in the error model 400 is $2n^2$, and in general each n-port standard generates $n^2$ equations. However, a standard that comprises a group of one-ports, such as shorts, provide $n^2/4$ equations per standard. With two general standards, the coefficient matrix, A, has a dimension of $2n^2$-by-$2n^2$ with rank $2n^2-n$. Hence, the rank can be made $2n^2-1$ with three or more standards. Using the calibration technique 200 of the present invention, the extra measurements from the three or more standards can be used to solve for the s-parameters of some of the standards. Hence, the calibration technique of the present invention provides improved accuracy in network analyzer applications utilizing half isolation. One skilled in the art can appreciate that the calibration technique 200 of the present invention can thus extend itself to a variety of desired isolation applications beyond those described in the present application. Hence, either all or some of the ports can be provided with port-to-port isolation correction using the calibration technique of the present invention.

Accordingly, there has been described a calibration technique which can solve for unknown network parameters of calibration standards. By solving for these unknown network parameters, such as s-parameters, during the calibration process, improved accuracy in the determination of the error correction terms (t-terms) can be achieved. Forming subset coefficient matrices and minors of these subsets allows for a plurality of unknown network parameters to be present in each of the calibration standards. A plurality of unknown network parameters of each calibration standard can now be solved using the calibration technique of the present invention. This is a significant advantage over the prior art which allows for only one unknown network parameter in the calibration standards. Various combinations of standards which are partially known, completely known, and completely unknown, can now be used to calibrate a network analyzer with improved accuracy.

The flexibility of the calibration technique described by the invention to use multiple standards having multiple unknowns makes it ideal for multi-port network analyzer applications. The flexibility and accuracy improvement achieved with the calibration technique of the present invention provide for an overall improved measurement system.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A method of calibrating a network analyzer, including the steps of:

providing and measuring sufficient calibration standards for an over-determined system of calibration equations;

solving for unknown network parameters of the calibration standards utilizing the over-determined system of calibration equations by:

selecting a matrix of coefficients from the over-determined system of calibration equations;

forming minors from the matrix of coefficients;

setting the minors equal to zero; and solving for the unknown network parameters of the calibration standards; and calibrating the network analyzer using the solved-for network parameters and the system of calibration equations.

2. A method of calibrating a network analyzer as described in claim 1, wherein the matrix of coefficients is characterized by a dimension and a rank, and each of the minors is characterized by a dimension greater than the rank of the matrix of coefficients.

3. A method of calibrating a network analyzer as described in claim 2, further including the step of repeating the step of selecting through the step of solving until all of the unknown network parameters of the calibration standards have been solved.

4. A method of calibrating a network analyzer as described in claim 3, further including the step of solving the over-determined system of calibration equations utilizing the solved network parameters of the calibration standards.

5. A method of calibrating a network analyzer as described in claim 4, wherein the step of solving the over-determined system of calibration equations includes the steps of:

inserting the solved network parameters back into the over-determined system of calibration equations;

removing equations from the over-determined system of calibration equations to form a square matrix of coefficients while retaining the rank; and calculating a nullspace from the square matrix of coefficients.

6. A method of calibrating a network analyzer as described in claim 4, wherein the network analyzer includes two or more ports and the step of solving the system of calibration equations provides port-to-port isolation correction between a predetermined number of the ports of the network analyzer.

7. A method of calibrating a network analyzer as described in claim 4, wherein the network analyzer includes two or more ports and the step of solving the system of calibration equations provides port-to-port isolation correction between all of the two or more ports of the network analyzer.

8. A method of solving for unknown network parameters of calibration standards during a calibration process of a network analyzer, comprising the steps of:

providing and measuring a plurality of calibration standards having a predetermined number of unknown network parameters;

generating, based on the plurality of calibration standards, a matrix of coefficients having a dimension and a rank, the rank being less than the dimension, the matrix of coefficients including at least one of the unknown network parameters of the calibration standards;

selecting, from the matrix of coefficients, a minor having a square dimension which is greater than the rank of the matrix of coefficients and encompassing at least one of the unknown network parameters of the calibration standards;

repeating the step of selecting a minor, until the number of minors is equivalent to the number of unknown network parameters of the calibration standards within the matrix of coefficients;

setting the minors equal to zero;

solving for the unknown network parameters of the calibration standards; and calibrating the network analyzer using the solved-for network parameters.

9. A method of solving for unknown network parameters of calibration standards as described in claim 8, comprising the further step of repeating the step of generating through the step of solving until all of the unknown parameters of the calibration standards are solved.

10. A method of calibrating a network analyzer when a set of calibration standards provide no ordinary solution to a system of calibration equations, and wherein the calibration standards are characterized by at least one unknown network parameter, including the steps of:

adding at least one calibration standard to the calibration, thereby providing an over-determined system of calibration equations;

selecting and measuring a subset of calibration standards to create a matrix of coefficients having at least one of the unknown network parameters of the calibration standards, the matrix of coefficients having a dimension and a rank, the rank being less than the dimension;

forming a predetermined number of minors, each having a dimension greater than the rank of the matrix of coefficients, the predetermined number being equivalent to the number of unknown network parameters of the calibration standards in the subset;

setting the minors equal to zero;

solving for the unknown network parameters of the calibration standards;

repeating the step of selecting through the step of solving until all the unknown network parameters of the calibration standards have been solved; and calibrating the network analyzer using the solved-for network parameters and system of calibration equations.

11. A method of calibrating a network analyzer as described in claim 10, further including the step of solving the over-determined system of calibration equations once all of the unknown network parameters of the calibration standards have been solved.

12. A method of calibrating a network analyzer as described in claim 11, wherein the step of solving the over-determined system of calibration equations includes the steps of:

inserting the solved network parameters back into the over-determined system of calibration equations;

removing equations from the over-determined system of calibration equations to form a square matrix of coefficients while maintaining the rank; and calculating a nullspace of the square matrix of coefficients.

13. A method of calibrating a network analyzer as described in claim 12, wherein the network analyzer includes at least two ports.

14. A method of calibrating a network analyzer as described in claim 13, wherein the step of solving the over-determined system of calibration equations provides port-to-port isolation correction between all of the at least two ports.

15. A method of calibrating a network analyzer as described in claim 13, wherein the step of solving the over-determined system of calibration equations provides port-to-port isolation correction between a predetermined number of the at least two ports.

16. A method of solving for a plurality of unknown network parameters of calibration standards during the calibration of a network analyzer, comprising the steps of:

selecting and measuring the calibration standards to form a matrix of coefficients including at least one of the plurality of unknown network parameters of the calibration standards;

forming minors from the matrix of coefficients, the minors including the at least one of the plurality of unknown network parameters of the calibration standards;

generating minor equations by equating the minors to zero;

solving the minor equations to solve for the at least one of the plurality of unknown network parameters of the calibration standards;

repeating the step of forming through the step of solving until the plurality of unknown network parameters of the calibration standards are solved; and calibrating the network analyzer using the solved-for network parameters.

17. The method of claim 16, wherein the unknown network parameters of the calibration standards comprise s-parameters.

18. A method of calibrating a multi-port network analyzer using a set of calibration standards providing an over-determined system of calibration equations, including the steps of:

selecting and measuring the set of calibration standards to form a matrix of coefficients from the over-determined system of calibration equations;

forming minors from the matrix of coefficients;

setting the minors equal to zero;

solving for unknown network parameters of the calibration standards; and calibrating the multi-port network analyzer using the solved-for network parameters and system of calibration equations.

19. A method of calibrating a multi-port network analyzer as described in 18, further including the steps of:

repeating the step of selecting through the step of solving until all of the unknown network parameters of the calibration standards have been solved; and solving the over-determined system of calibration equations once all of the unknown network parameters of the calibration standards have been solved.

20. A method of calibrating a multi-port network analyzer as described in 19, wherein the step of solving the over-determined system of calibration equations includes the steps of:

inserting the solved network parameters back into the over-determined system of calibration equations;

removing equations from the over-determined system of calibration equations to form a square matrix; and calculating error terms from the square matrix of coefficients.

* * * * *